US000001081H

United States Statutory Invention Registration [19]

[11] Reg. Number: H1081

Dixon, Jr.

[43] Published: Jul. 7, 1992

[54] MONOLITHIC MILLIMETER-WAVE IMAGE GUIDE BALANCED MIXER

[75] Inventor: Samuel Dixon, Jr., Neptune, N.J.

[73] Assignee: The United States of America as represented by the Secretary of the Army, Washington, D.C.

[21] Appl. No.: 638,725

[22] Filed: Jan. 2, 1991

Related U.S. Application Data

[63] Continuation of Ser. No. 171,323, Mar. 21, 1988, abandoned.

[51] Int. Cl.[5] ..... H04B 1/26

[52] U.S. Cl. ..... 455/326; 455/325; 455/330; 455/327; 357/15

[58] Field of Search ..... 455/325, 326, 327, 330; 357/15

[56] References Cited

U.S. PATENT DOCUMENTS 4,553,266 11/1985 Bates et al. ..... 458/327
4,739,519 4/1988 Findley ..... 458/327
4,855,796 8/1989 Wong et al. ..... 357/15

*Primary Examiner*—Bernarr E. Gregory
*Attorney, Agent, or Firm*—Michael Zelenka; William H. Anderson

[57] ABSTRACT

A monolithic millimeter wave balanced mixer in which two Schottky barrier diodes receive combined power from. Two Schottky barrier diodes receive combined power from an RF source and local oscillator in a gallium arsenide image guide. The diodes produce an intermediate frequency which is directed to a microstrip low pass filter.

1 Claim, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

MONOLITHIC MILLIMETER-WAVE IMAGE GUIDE BALANCED MIXER

The invention described herein may be manufactured, used, and licensed by or for the Government for governmental purposes without the payment of any royalties thereon or therefor.

This application is a continuation of application Ser. No. 07/171,323, filed Mar. 21, 1988, now abandoned.

TECHNICAL FIELD

This invention relates generally to mixers and more particularly to millimeter-wave monolithic mixers.

BACKGROUND OF THE INVENTION

A mixer is a device which converts an incoming from one frequency to another by combining it with a local oscillator signal in a non-linear device. In general, mixing produces a large number of sum and difference frequencies. Usually, the difference frequency between the signal (RF frequency) and local oscillator (LO frequency) is of interest. Mixers are often used in radar systems to convert an incoming RF before further processing.

Monolithic technology has been widely used at lower frequencies (less than 30 GHz) and has proven to be attractive for addressing the problems of cost, size and weight. Those concerned with the development of radars into the millimeter-wave region must often deal with parts which require precise tolerances and are difficult to fabricate. There is a continuing need for low cost radar components with designs amenable to mass production.

SUMMARY OF THE INVENTION

Accordingly, it is an object of the invention to provide a mixing device suitable for use in high frequency communication and radar systems.

A further object of the present invention is to provide a low cost mass-producible, dielectric compatible mixing device suitable for application in modern millimeter-wave radar systems.

Still another object of the present invention is to provide a signal mixer fabricated as a monolithic integrated circuit structure.

Briefly, these and other objects are accomplished with a gallium arsenide (or other semiconductor) image guide structure with two in-situ Schottky barrier diodes. The two Schottky diodes provide an IF signal with a frequency which is the difference between the incident RF signal and the local oscillator LO signal. (Of course, other frequencies are also produced). The outputs from the Schottky diodes are coupled to a microstrip low pass filter to isolate the desired IF frequency.

BRIEF DESCRIPTION OF THE DRAWINGS

Further objects and advantages of the present will become apparent to those familiar with the art upon examination of the following detailed description and accompanying drawings in which.

DETAILED DESCRIPTION OF THE PREFERRED EMBODIMENT

Figure 1:
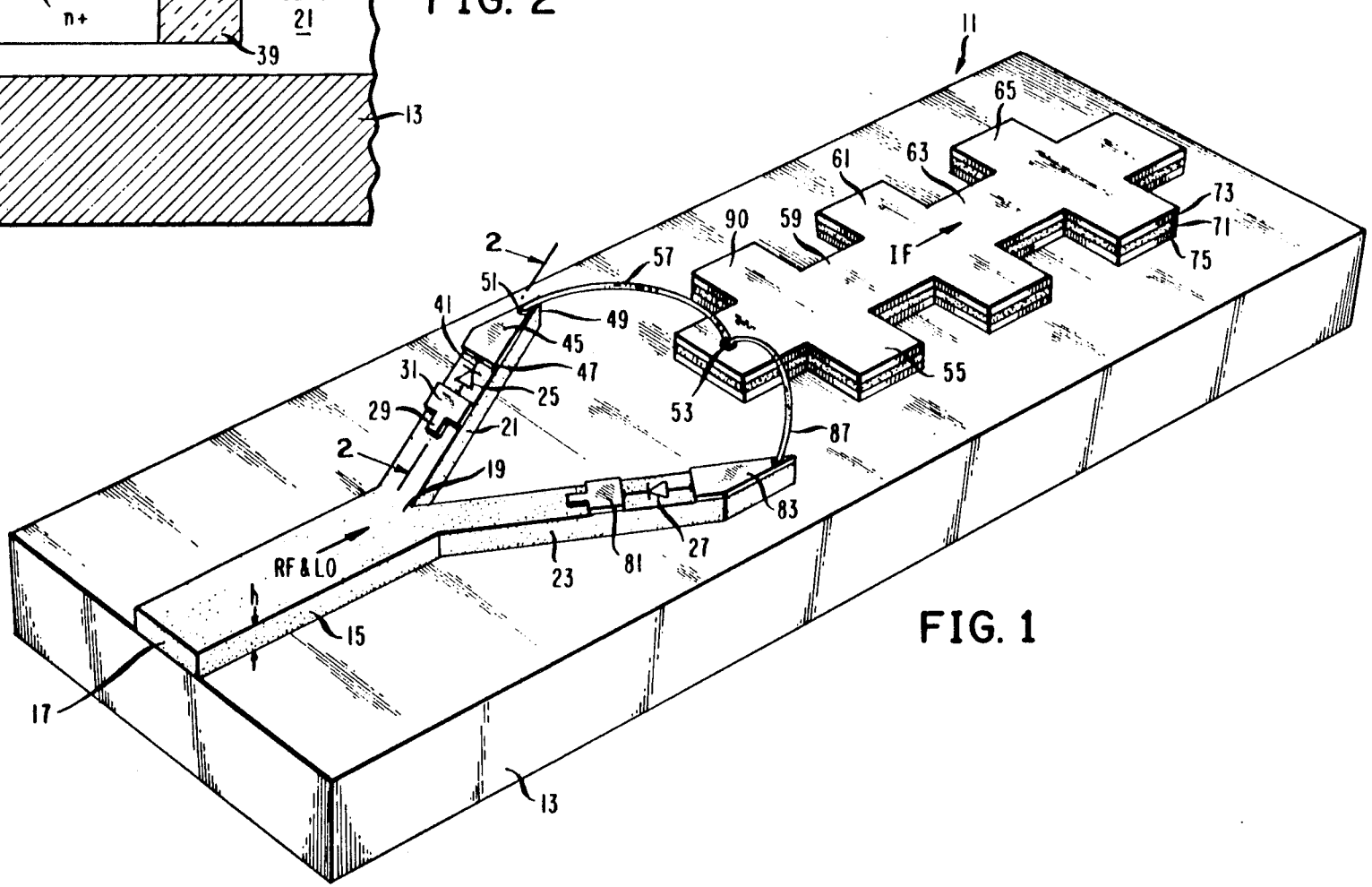
FIG. 1 is a partially perspective, partially schematic view of the inventive device.

Referring to FIG. 1, the inventive device is shown generally by reference numeral 11. A metallic end plate is designated by reference numeral 13. A Y-shaped gallium arsenide image guide 15 is deposited upon metallic end plate 13. The input RF and local oscillator LO signals are coupled to end 17 of image guide 15.

The image guide 15 is preferentially made from semi-insulating gallium arsenide. Semi-insulating gallium arsenide is doped with chromium which tends to pin the Fermi level near the center of the energy band gap, thus producing a material with a high resistivity and high dielectric constant.

Application of theoretical considerations indicates that the height, h, of image guide 15 should be roughly one-half to one wavelength (in the RF or LO signal) in the semiconductor medium. Obviously, the relative heights of image guide 15 and metallic end plate 13 are not drawn to scale in the interests of clarity.

Both the RF and LO signals propagate together through image guide 15 until branch point 19 is reached. At point 19, half of the combined incident power goes into leg 21, while the other half of the combined incident power proceeds into leg 23 of image guide 15.

Both legs 21 and 23 contain respective Schottky diodes 25 and 27. It should be noted that Schottky diodes 27 and 25 are oriented in opposite directions. The opposite orientation of Schottky diodes 25 and 27 permits maximum utilization of the power from the combined RF and LO signals.

The details of the construction and orientation of Schottky diode 25 in leg 21 will now be discussed. The discussion is also appropriate to the construction of leg 23 and its associated Schottky diode 27, except for diode orientation.

As the combined RF and LO signals proceed from branch point 19 through leg 21 they encounter gold metallization 31. Gold metallization 31 is deposited as a thin film upon the top of leg 21. Projection 29 of gold metallization 31 provides a resonance effect which prevents backward reflection of the combined incident RF and LO signals.

Figure 2:
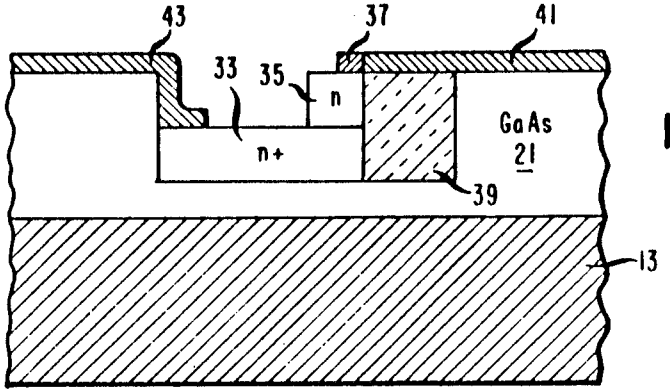
FIG. 2 is a cross sectional view of a portion of FIG. 1 showing the details of the Schottky barrier diode construction.

The details of the construction Schottky diode 25 can best be understood with reference to FIG. 2. Schottky diode 25 is grown in-situ by well-known vapor phase epitaxy or molecular beam epitaxy techniques. A layer of $n^+$ gallium arsenide material 33 is deposited in a cavity in the semi-insulating gallium arsenide material forming leg 21. A layer of n gallium arsenide material 35 is deposited upon layer 33. Layer 35 does not completely cover layer 33. A Schottky barrier is formed upon the top of layer 35 by deposition of a titanium gold composition metal 37. Layer 37 does not completely cover layer 35. A gold beam lead 41 (shown in both FIGS. 1 and 2) forms electrical contact with the titanium gold composition 37. Contact between the beam lead 41 and the n layer 35 and $n^+$ layer 33 is prevented by dielectric 39 which is preferably silicon nitride. Layer 43 is ohmic metal, preferably gold germanium nickel alloy and it contacts the $n^+$ layer 33. Layer 43 may be covered by a gold beam lead on top, if desired. Beam lead 43 is also illustrated in FIG. 1. As seen in FIG. 1, beam lead 41 is connected to the cathode of diode 25, while 43 is connected to the anode of diode 75.

Beam lead 43 contacts gold metallization 45. The distance between points 47 and 49 of gold metallization 45 is chosen to be approximately ½ wave length of the local oscillator frequency in the semiconductor material (gallium arsenide in the embodiment illustrated herein). The dimensioning between points 47 and 49 is chosen to provide cancellation of the RF and LO frequencies, thus permitting only the sum and difference frequencies and their harmonics to propagate. Terminal 51 is connected to terminal 53 of low pass filter 55 by connector 57. Connector 57 may be made from gold wire. To prevent radiation, in a preferred embodiment, connector 57 is a small coaxial cable whose outer sheath is tied to ground plane 13.

Low pass filter 55 is designed according to techniques well-known to those skilled in the art. In a preferred embodiment low pass filter 55 is made from DUROID. DUROID is the name of a trademarked material which contains a dielectric material 71 between two copper sheets 73 and 75. The DUROID low pass filter may be attached to metallic end plate 13 by conductive epoxy. The configuration of low pass filter 55 is determined by techniques well-known to those skilled in the art. The configuration illustrated in FIG. 1 shows broad capacitive elements 61 and 65 together with inductive portions 59 and 63. Low pass filter 55 permits only the desired difference frequency (IF frequency) to propagate while attenuating other undesired frequencies.

Arm 23 works like arm 21. Metallizations 81 and 83 are configured similar to metallizations 31 and 45. Schottky diode 27 is fabricated in the manner analogous to that described for Schottky diode 25—except that cathode and anode are reversed. Connector 87 connects terminals 85 and 53 in a manner analogous to that in which connector 57 connects terminals 51 and 53.

This novel monolithic mixer device can be fabricated in large volumes using a cutting device to punch out gallium arsenide image guide 15 and then processing the in-situ Schottky diodes 25 and 27.

The illustrative embodiment herein is merely one of those possible variations which will occur to those skilled in the art the inventive principles contained herein. Accordingly, numerous variations of invention are possible while staying within the spirit and scope of the invention as defined in the following claims and their legal equivalents.

What is claimed is:

1. A mixer comprising:

a conductive ground plane;

a solid waveguide structure disposed on said ground plane, said waveguide structure having an image guide and first and second output legs wherein the image guide and the output legs are connected so as to form a power divider;

first and second Schottky barrier diodes grown in situ on said first and second output legs and electrically connected thereto, said Schottky barrier diodes comprising a layer of $n^+$ semiconductive material, a layer of n semiconductive material deposited on said $n^+$ semiconductive layer such that said n semiconductive layer does not cover said $n^+$ semiconductive layer, a layer of conductive material deposited on said n semiconductive layer such that said conductive layer does not completely cover said n semiconductive layer, a conductive beam lead that is deposited in electrical contact with said conductive layer, a dielectric layer which is deposited under said conductive beam lead such that said conductive beam lead does not contact said n and $n^+$ semiconductive layers, and an ohmic metal layer which is deposited in electrical contact with said $n^+$ semiconductive layer and opposite said conductive beam lead;

first and second connectors connected respectively to said first and second Schottky diodes; and a low pass filter electrically connected to said first and second Schottky diodes via the first and second connectors.

* * * * *